(12) United States Patent
Rachmady et al.

(10) Patent No.: US 8,294,223 B2
(45) Date of Patent: Oct. 23, 2012

(54) METAL GATE STRUCTURE AND METHOD OF MANUFACTURING SAME

(75) Inventors: Willy Rachmady, Beaverton, OR (US); Soley Ozer, Portland, OR (US); Jason Klaus, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/966,060

(22) Filed: Dec. 13, 2010

(65) Prior Publication Data

US 2011/0079830 A1   Apr. 7, 2011

Related U.S. Application Data

(62) Division of application No. 12/154,307, filed on May 21, 2008, now Pat. No. 7,875,519.

(51) Int. Cl.
*H01L 21/70* (2006.01)

(52) U.S. Cl. .......... 257/407; 257/288; 257/E27.06; 257/E29.16

(58) Field of Classification Search .......... 257/288, 257/407, E27.06, E29.16
See application file for complete search history.

(56) References Cited

U.S. PATENT DOCUMENTS

| | | | |
|---|---|---|---|
| 4,752,505 A | 6/1988 | Arac | |
| 4,920,403 A | 4/1990 | Chow et al. | |
| 5,937,303 A | 8/1999 | Gardner et al. | |
| 6,184,129 B1 | 2/2001 | Hwang et al. | |
| 6,222,279 B1 | 4/2001 | Mis et al. | |
| 6,429,126 B1 | 8/2002 | Herner et al. | |
| 6,939,764 B2 | 9/2005 | Chen et al. | |
| 7,253,049 B2 | 8/2007 | Lu et al. | |
| 7,381,597 B2 | 6/2008 | Lin | |
| 7,544,594 B2 * | 6/2009 | Change | 438/585 |
| 7,776,729 B2 | 8/2010 | Rachmady et al. | |
| 2002/0158286 A1 * | 10/2002 | Chediak et al. | 257/325 |
| 2004/0175910 A1 | 9/2004 | Pan et al. | |
| 2005/0070109 A1 | 3/2005 | Feller et al. | |
| 2005/0215038 A1 | 9/2005 | Hall et al. | |

(Continued)

FOREIGN PATENT DOCUMENTS

WO   2009/142982 A2   11/2009

(Continued)

OTHER PUBLICATIONS

Office Action received for German Patent Application No. 11 2009 000 670.1, mailed on Apr. 26, 2011, 5 pages of German office action including 2 pages of English translation.

(Continued)

*Primary Examiner* — Eduardo A Rodela
(74) *Attorney, Agent, or Firm* — Kenneth A. Nelson

(57) ABSTRACT

A method of manufacturing a metal gate structure includes providing a substrate (110) having formed thereon a gate dielectric (120), a work function metal (130) adjacent to the gate dielectric, and a gate metal (140) adjacent to the work function metal; selectively forming a sacrificial capping layer (310) centered over the gate metal; forming an electrically insulating layer (161) over the sacrificial capping layer such that the electrically insulating layer at least partially surrounds the sacrificial capping layer; selectively removing the sacrificial capping layer in order to form a trench (410) aligned to the gate metal in the electrically insulating layer; and filling the trench with an electrically insulating material in order to form an electrically insulating cap (150) centered on the gate metal.

5 Claims, 4 Drawing Sheets

U.S. PATENT DOCUMENTS

| | | |
|---|---|---|
| 2006/0040482 A1 | 2/2006 | Yang et al. |
| 2006/0199321 A1 | 9/2006 | Lo et al. |
| 2006/0237821 A1 | 10/2006 | Lee et al. |
| 2006/0263966 A1* | 11/2006 | Kim et al. .................. 438/218 |
| 2008/0001236 A1 | 1/2008 | Chang |

FOREIGN PATENT DOCUMENTS

| | | |
|---|---|---|
| WO | 2009/142982 A3 | 3/2010 |

OTHER PUBLICATIONS

International Preliminary Report on Patentability received for PCT Application No. PCT/US2009/043898, Mailed on Dec. 2, 2010, 6 pages.

Creighton, J. R., "A Mechanism for Selectivity Loss during Tungsten CVD", J. Electrochem. Soc., vol. 136 No. 1, Jan. 1989, pp. 271-276.

Itoh, H., et al., "Machanism for Initial Stage of Selective Tungsten Growth Employing a WF6 and SiH4 Mixture", Japanese Journal of Applied Physics, vol. 30, No. 7, Jul. 1991, p. 1525-1529.

Brown, D.M., et al., "Selective CVD Tungsten via Plugs for Multilevel Metalization", IEEE, IEDM 91, 1986, 6 pgs.

Bradbury, D.R., et al., "Selective CVD Tungsten as an Alternative to Blanket Tungsten for Submicron Plug Applications on VLSI Circuits", 1991, IEEE, IEDM 91, pp. 273-276.

Mehta, S., et al., "Selective CVD Tungsten in VLSI Contract Technology", Intel Technology Journal, pp. 22-28.

Gorczyca, T. B., et al., "Selective Tungsten CVD in a Hot Walled Reactor by Silane Reduction of WF6", Sep. 1989, pp. 2765-2766.

"Kobayashi, N., et al., ""Study on Mechanism of Selective Chemical Vapor Deposition of Tungsten Using in situ Infrared Spectroscopy and Auger Electron Spectroscopy"", J. Appl. Phys. 69 (2), Jan. 15, 1991, pp. 1013-1019".

Chang, K., et al., "Characteristics of Selective Chemical Vapor Deposition of Tungsten on Aluminum with a Vapor Phase Precleaning Technology", J. Electrochem Soc., vol. 144, No. 1, Jan. 1997, pp. 251-259.

Kang, S., et al., "Application of Selective CVD Tungsten for Low Contact Resistance Via Filing to Aluminum Multilayer Interconnection", Journal of Electronic Materials, vol. 17, No. 3, 1988, pp. 213-216.

International Search Report and Written Opinion received for PCT Application No. PCT/US2009/043898, mailed on Dec. 24, 2009, 11 pages.

Office Action received for Chinese Patent Application No. 200980110701.8, mailed on Oct. 14, 2011, 4 pages of Chinese office action including 8 pages of English translation.

* cited by examiner

METAL GATE STRUCTURE AND METHOD OF MANUFACTURING SAME

CLAIM OF PRIORITY

This application is a divisional of U.S. patent application Ser. No. 12/154,307, now U.S. Pat. No. 7,875,519, which was filed on May 21, 2008.

FIELD OF THE INVENTION

The disclosed embodiments of the invention relate generally to metal gate structures for microelectronic devices, and relate more particularly to protective etch stop layers for such gate structures.

BACKGROUND OF THE INVENTION

Field-effect transistors (FETs) include source, drain, and gate terminals that are associated with a body terminal. In order to provide the necessary electrical connections within the transistor, contact structures must be formed that connect various terminals to other structures within and outside of the transistor. As pitch scaling continues to increase the packing density of transistors on computer chips, the space available for forming such electrical contacts is rapidly decreasing.

In one FET configuration, source and drain terminals are located within the body and the gate is located above the body such that, in order to form an electrical connection with the source/drain terminal, the source/drain contacts must pass alongside the gate. Given existing pitch scaling trends, the creation of unwanted electrical connections (shorts) between source/drain terminals and the gate will quickly become unavoidable given the limitations of registration and critical dimension (CD) control under existing transistor manufacturing techniques.

BRIEF DESCRIPTION OF THE DRAWINGS

The disclosed embodiments will be better understood from a reading of the following detailed description, taken in conjunction with the accompanying figures in the drawings in which.

Figure 1:
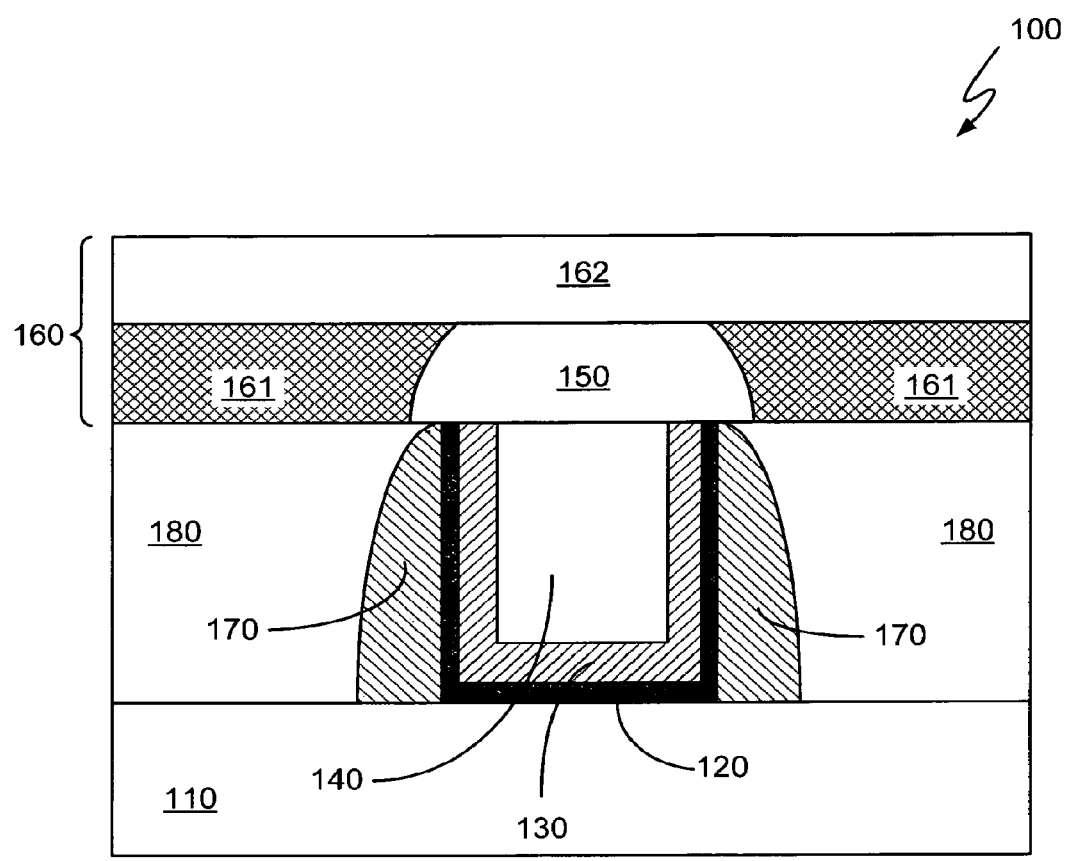
FIG. 1 is a cross-sectional view of a metal gate structure according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a method of manufacturing a metal gate structure comprises: providing a substrate having formed thereon a gate dielectric, a work function metal adjacent to the gate dielectric, and a gate metal adjacent to the work function metal; selectively forming a sacrificial capping layer centered over the gate metal; forming an electrically insulating layer over the sacrificial capping layer such that the electrically insulating layer at least partially surrounds the sacrificial capping layer; selectively removing the sacrificial capping layer in order to form a trench aligned to the gate metal in the electrically insulating layer; and filling the trench with an electrically insulating material in order to form an electrically insulating cap centered on the gate metal.

As mentioned above, source/drain to gate contact shorts are projected to become increasingly difficult to avoid in light of the aggressive pitch scaling necessary in order to achieve the high transistor densities that will accompany future process technologies. Self-aligned capping structures on copper gate electrodes have been demonstrated and could offer a partial solution to this problem but are not expected to be useful at gate dimensions below 35 nanometers (nm), as copper fill processes become very marginal at those dimensions.

Embodiments of the invention provide a method to form a self-aligned protective cap on aluminum and other metal gate transistors even at gate dimensions less than 35 nm because the gate formation is not limited by gate electrode fill. Such protective caps may provide robust margins for contact registration and may also allow contact CD to be larger, thereby lowering contact resistance.

Referring now to the drawings, FIG. 1 is a cross-sectional view of a metal gate structure 100 according to an embodiment of the invention. As illustrated in FIG. 1, metal gate structure 100 comprises a substrate 110, a gate dielectric 120 over substrate 110, a work function metal 130 adjacent to gate dielectric 120, and a gate metal 140 adjacent to work function metal 130. Metal gate structure 100 further comprises an electrically insulating cap 150, which, because it only grows on the metal gate, is centered on and self-aligned to gate metal 140, an electrically insulating layer 160 over and at least partially surrounding electrically insulating cap 150, spacers 170 adjacent to the gate dielectric 120, and a dielectric material 180, e.g., an inter-layer dielectric (ILD) such as a first-level ILD (ILD0), at least partially surrounding spacers 170. Electrically insulating layer 160 comprises a lower section 161 and an upper section 162.

As an example, gate metal 140 can be a metal or a metal alloy such as aluminum, tungsten, titanium-nitride, or the like, or any metal or alloy (in addition to those already listed) that lends itself to atomic layer deposition (ALD). It should be noted here that work function metal 130 can be the same material as that making up gate metal 140. As another example, electrically insulating cap 150 can comprise silicon nitride ($Si_3N_4$), silicon carbide (SiC), or the like, or any non-electrically conducting (dielectric) material that can function as a etch stop layer for a particular etch chemistry used during the manufacture of metal gate structure 100, as will be further discussed below.

As another example, gate dielectric 120 can be a material having a relatively high dielectric constant. (As is traditional, such a material is referred to herein as a "high-k material," a "high-k dielectric," or something similar.) Silicon dioxide ($SiO_2$), which was widely used in the past as a gate dielectric, has a dielectric constant $\kappa$ (often written as "k") of approximately 3.9. References in this document to high-k materials mean materials having dielectric constants that are significantly greater than the dielectric constant of $SiO_2$. In practice, such materials typically have dielectric constants of approximately 8-10 or higher (although materials having dielectric constants lower than that may still qualify as high-k materials). Similarly, references herein to a "low-k" material mean materials having a dielectric constant that is low relative to that of $SiO_2$, e.g., materials having dielectric constants less than approximately 3.5.

As an example, gate dielectric 120 may be a hafnium-based, a zirconium-based, or a titanium-based dielectric material having a dielectric constant of at least approximately 20. In a particular embodiment the high-k material can be hafnium oxide or zirconium oxide, both of which have a dielectric constant between approximately 20 and approximately 40.

As yet another example, lower section 161 of electrically insulating layer 160 can comprise silicon oxide or another dielectric material. In certain embodiments, lower section 161 is a low-k dielectric material. In certain embodiments, upper section 162 of electrically insulating layer 160 comprises dielectric material identical to that in lower section 161 such that any boundary between lower section 161 and upper section 161 is not readily discernible, or disappears entirely. In other embodiments, upper section 162 and lower section 161 may comprise electrically insulating materials of different types.

Figure 2:
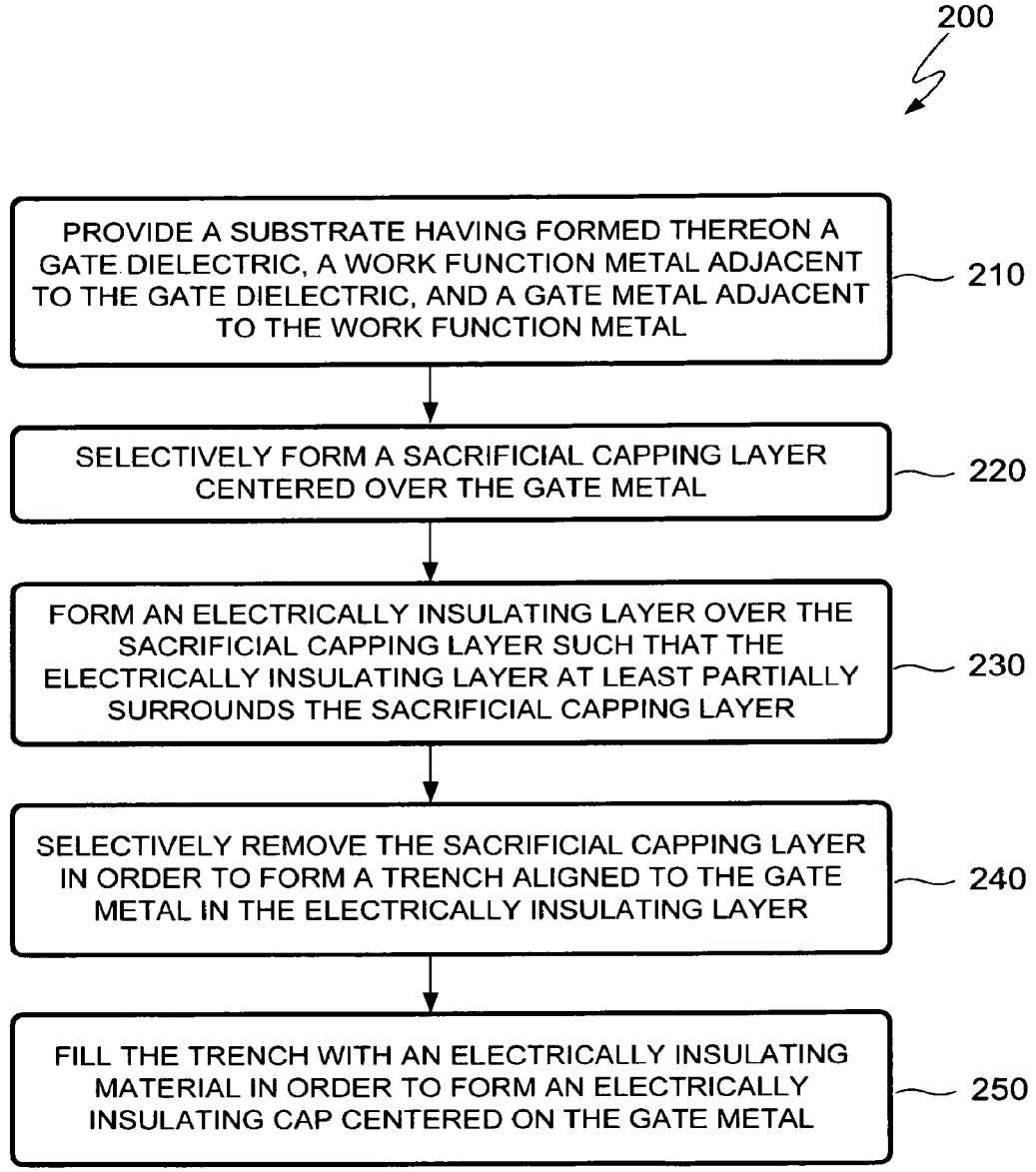
FIG. 2 is a flowchart illustrating a method of manufacturing a metal gate structure according to an embodiment of the invention.

FIG. 2 is a flowchart illustrating a method 200 of manufacturing a metal gate structure according to an embodiment of the invention. As an example, method 200 may result in a transistor having a self-aligned protective cap on an aluminum or other gate metal that provides advantages such as those discussed herein.

A step 210 of method 200 is to provide a substrate having formed thereon a gate dielectric, a work function metal adjacent to the gate dielectric, and a gate metal adjacent to the work function metal. As an example, the substrate, the gate dielectric, the work function metal, and the gate metal can be similar to, respectively, substrate 110, gate dielectric 120, work function metal 130, and gate metal 140, all of which are shown in FIG. 1. Also as part of step 210, or in another step, spacers may be formed adjacent to the high-k gate dielectric and an ILD may be formed adjacent to the spacers. As an example, the spacers can be similar to spacers 170 and the ILD can be similar to dielectric material 180, both of which are first shown in FIG. 1.

In one embodiment, step 210 or a subsequent step may comprise exposing the gate metal to a buffered hydrofluoric acid solution or a dilute hydrochloric acid solution. As an example, the buffered hydrofluoric acid solution may comprise hydrofluoric acid, de-ionized water, and a buffering agent such as ammonium fluoride or the like. The buffering agent maintains the hydrofluoric acid solution at an appropriate pH level, which in at least one embodiment is a pH between 4 and 6. As another example, the dilute hydrochloric acid solution may comprise one part per volume hydrochloric acid (29% aqueous solution) and 10 parts per volume de-ionized water. In one embodiment, the gate metal is exposed to the buffered hydrofluoric acid solution for a period of time lasting between approximately ten and approximately sixty seconds. (Longer exposure times may begin to etch or otherwise negatively affect other parts of metal gate structure 100, such as ILD0.)

Figure 3:
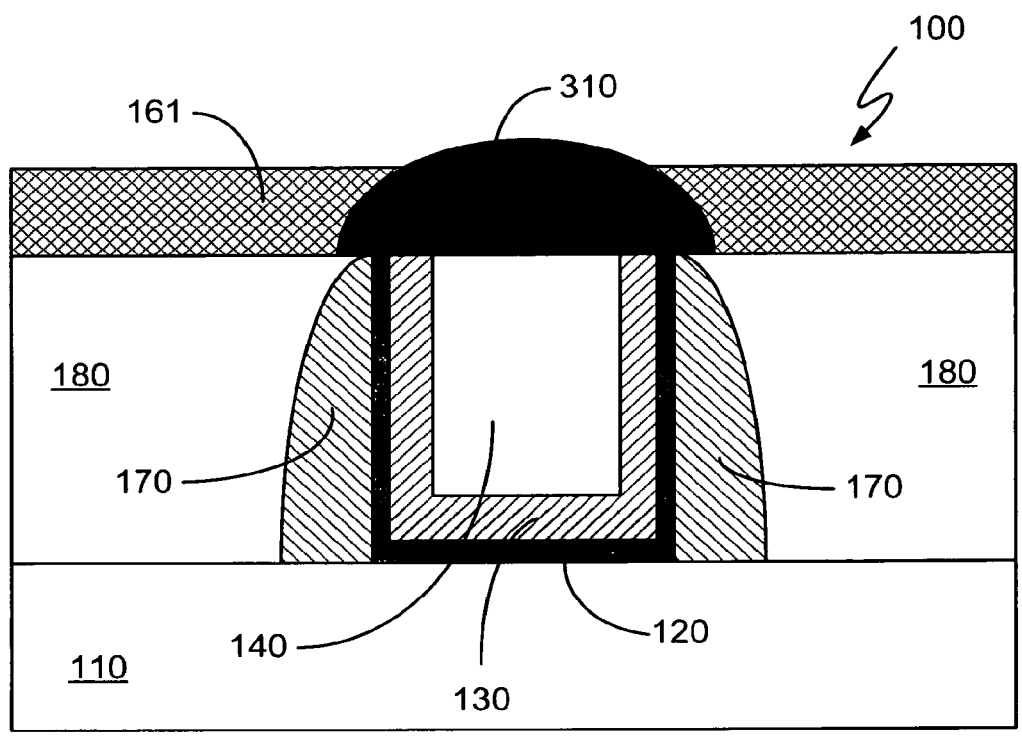
FIGS. 3-5 are cross-sectional views of the metal gate structure of FIG. 1 at various particular points in its manufacturing process according to embodiments of the invention.

A step 220 of method 200 is to selectively form a sacrificial capping layer centered over the gate metal. (As further discussed below, the phrase "selective formation" and similar phrases herein refer to processes that allow a first material to be formed on a second material or material type but not on a third material or material type.) As an example, the sacrificial capping layer can be similar to a sacrificial capping layer 310 that is first shown in FIG. 3, which is a cross-sectional view of metal gate structure 100 at a particular point in its manufacturing process according to an embodiment of the invention. It should be noted that FIG. 3 depicts metal gate structure 100 at an earlier point in its manufacturing process than does FIG. 1.

As an example, sacrificial capping layer 310 can comprise tungsten or another material that can form a self-aligned structure on top of gate metal 140. Described below is an embodiment in which sacrificial capping layer 310 comprises tungsten and gate metal 140 comprises aluminum.

Chemical vapor deposition of tungsten (CVD-W) is an important metallization technique for various applications. In ultra-large-scale integrated circuit (ULSI) applications CVD-W is often used to fill contact vias due to its ability to fill high aspect ratio structures with no voiding. Another aspect of CVD-W is its ability, under certain deposition conditions, to selectively deposit onto silicon or other metals but not onto SiO2 or other insulators.

Embodiments of the invention exploit this selective deposition capability to form sacrificial capping layer 310 self-aligned to (i.e., centered on) the aluminum of gate metal 140. In one embodiment, for example, tungsten is selectively deposited using a CVD technique in which high flow (e.g., approximately 1 Torr) hydrogen ($H_2$) and low flow (e.g., approximately 30 mTorr) tungsten hexafluoride ($WF_6$) precursors are introduced into a CVD chamber at a temperature between approximately 200 degrees Celsius (° C.) and approximately 300° C. with approximately 5-10 CVD cycles. A sequence of chemical reactions for this embodiment are shown below, where Al is aluminum, $AlF_3$ is aluminium trifluoride, $AlF_2$ is aluminum difluoride, and HF is hydrofluoric acid.

$$WF_6 + 2Al \rightarrow W + AlF_3$$

$$2AlF_3 \rightarrow 3AlF_2 \text{(Heated above 300° C.)}$$

$$WF_6 + 3H_2 \rightarrow W + 6HF$$

In a particular embodiment, the reaction of step 220 is performed at a temperature between approximately 200° C. and approximately 275° C., with lower temperatures in this range preferred. If the temperature is too high (e.g., above approximately 300° C.) then the tungsten may begin to alloy with the aluminum, compromising the gate structure. On the other hand, if the temperature is too low (e.g., below approximately 200° C.) then the desired selectivity begins to be lost.

A step 230 of method 200 is to form an electrically insulating layer over the sacrificial capping layer such that the electrically insulating layer at least partially surrounds the sacrificial capping layer. As an example, the electrically insulating layer can be similar to lower section 161 of electrically insulating layer 160 that is shown in FIG. 1. After its deposition the electrically insulating layer is planarized and polished back so as to expose the tungsten (or other) sacrificial capping layer.

Figure 4:
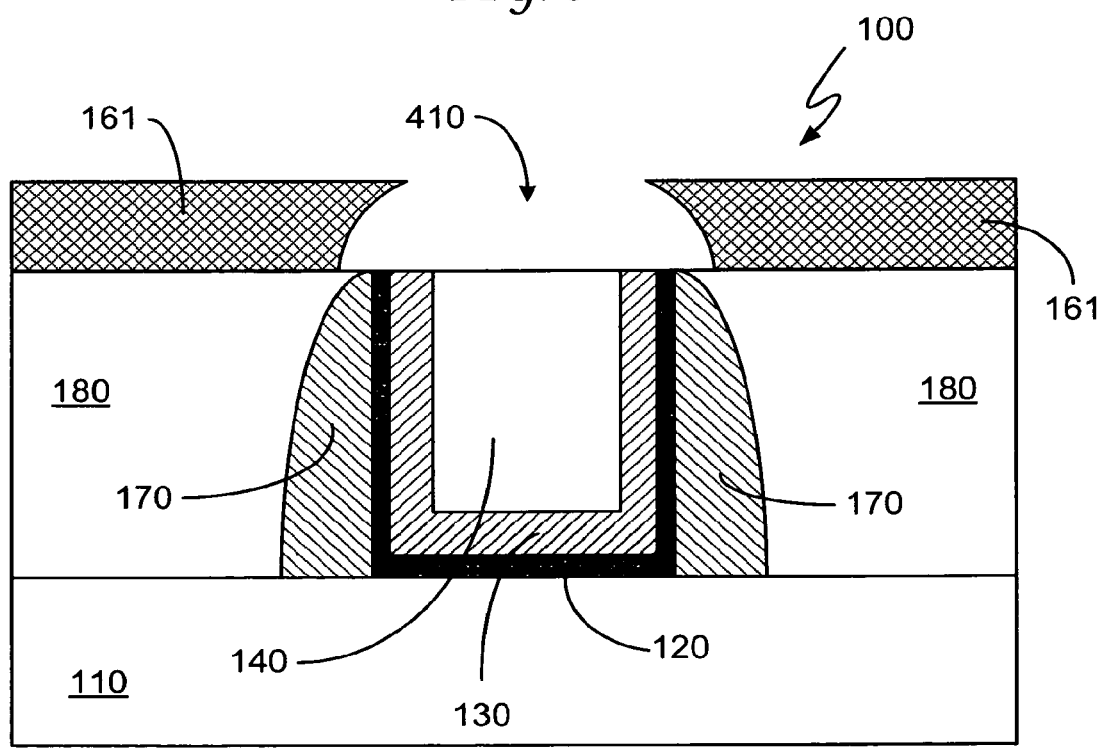

A step 240 of method 200 is to selectively remove the sacrificial capping layer in order to form a trench aligned to the gate metal in the electrically insulating layer. It should be understood that the word "trench" as used in this context herein is used broadly such that it can indicate any type of an opening, a gap, a cavity, a hole, an empty space, or the like that can later be filled with a material, as discussed below. As an example, the trench can be similar to a trench 410 that is first shown in FIG. 4, which is a cross-sectional view of metal gate structure 100 at a particular point in its manufacturing process according to an embodiment of the invention. It should be noted that FIG. 4, like FIG. 3, depicts metal gate structure 100 at an earlier point in its manufacturing process than does FIG. 1. As illustrated in FIG. 4, trench 410 is located above, and aligned to, gate metal 140.

In one embodiment, step 240 comprises etching away the sacrificial capping layer using an etchant comprising a base and an oxidizer. As an example, the base can comprise ammonium hydroxide ($NH_4OH$), tetra methyl ammonium hydroxide (TMAH), or the like. As another example, the oxidizer can comprise hydrogen peroxide ($H_2O_2$), dissolved ozone ($O_3$), or the like. As yet another example, the etchant can have a pH between 4 and 10. In a particular embodiment, the pH of the etchant is between 6 and 8. With conditions and compositions such as those given above, an etchant used in connection with embodiments of the invention selectively dissolves tungsten, i.e., dissolves tungsten and not aluminum or the work function metal, thereby allowing the formation of a self-aligned protective cap over an aluminum gate (or gates made of other materials), as further discussed below.

A step 250 of method 200 is to fill the trench with an electrically insulating material in order to form an electrically insulating cap centered on the gate metal. As an example, the electrically insulating cap can be similar to electrically insulating cap 150 that is shown in FIG. 1. This electrically insulating cap completely covers and protects the underlying gate electrode by, for example, acting as an etch stop layer during source/drain contact etch. As an example, the composition of the electrically insulating cap and/or the etch chemistry of the source/drain contact etch may be chosen such that the electrically insulating cap is substantially impervious to the contact etch chemistry in order that the contact etch may proceed without raising gate metal damage issues. This in turn leads to increased contact registration margins and other advantages as discussed above.

Figure 5:
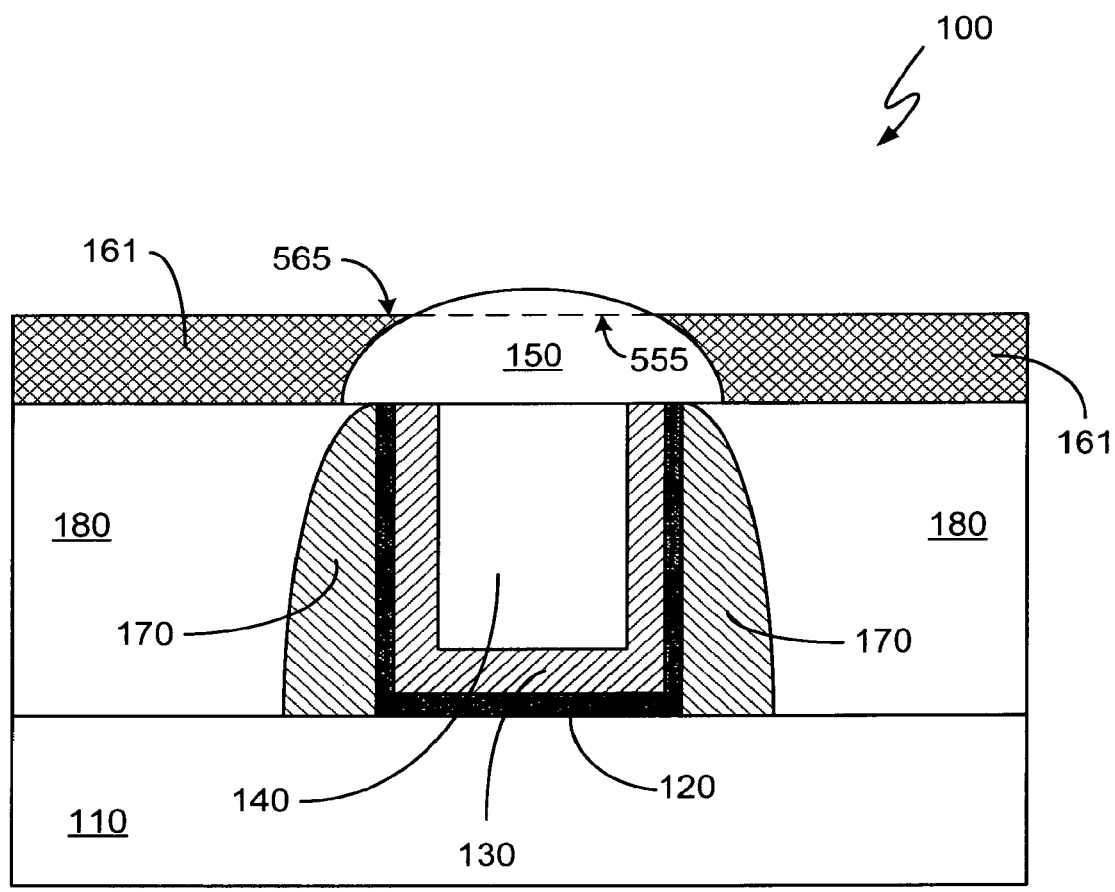

Electrically insulating cap 150 is also shown in FIG. 5, which is a cross-sectional view of metal gate structure 100 at a particular point in its manufacturing process according to an embodiment of the invention. It should be noted that FIG. 5, like FIGS. 3 and 4, depicts metal gate structure 100 at an earlier point in its manufacturing process than does FIG. 1. FIG. 5 illustrates electrically insulating cap 150 immediately after its deposition, at which time it has a rounded top; the substantially flat top it is subsequently given (see FIG. 1) is produced by polishing back electrically insulating cap 150 so that it is flush with a surface 565 of lower section 161 of electrically insulating layer 160. A dotted line 555 in FIG. 5 indicates a level to which electrically insulating cap may, in at least one embodiment, be polished back.

Following the polishing back of electrically insulating cap 150, upper section 162 of electrically insulating layer 160 may be deposited over lower section 161. As an example, metal gate structure 100 may then take the form that it is depicted in FIG. 1 and electrically insulating cap 150 will entirely protect gate metal 140 during source/drain contact etch, as has been described herein.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the metal gate structures and related methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An apparatus comprising:
   a substrate;
   a gate dielectric over the substrate;
   a work function metal adjacent to the gate dielectric;
   a gate metal adjacent to the work function metal;
   an electrically insulating cap centered on the gate metal;
   an electrically insulating layer over and at least partially
      surrounding the electrically insulating cap, the electrically insulating layer comprising a first section having a
      surface that is co-planar with a surface of the electrically insulating cap, the first section comprising a low-k material, and further comprising a second section above the first section, the second section also comprising the low-k material;
spacers adjacent to the gate dielectric; and
a dielectric material at least partially surrounding the spacers.

2. The apparatus of claim 1 wherein:
the gate metal is a substance taken from the group consisting of aluminum, tungsten, and titanium-nitride.

3. The apparatus of claim 1 wherein:
the electrically insulating cap is a substance taken from the group consisting of silicon nitride and silicon carbide.

4. The apparatus of claim 1 wherein:
the gate dielectric is a high-k dielectric material.

5. The apparatus of claim 1 wherein:
the work function metal and the gate metal are the same material.

* * * * *